United States Patent
Ahn

[19]

[11] Patent Number: 6,092,223
[45] Date of Patent: Jul. 18, 2000

[54] REDUNDANCY CIRCUIT FOR SEMICONDUCTOR INTEGRATED CIRCUIT

[75] Inventor: Yeong-Chang Ahn, Cheongju, Rep. of Korea

[73] Assignee: LG Semicon Co., Ltd., Cheongju, Rep. of Korea

[21] Appl. No.: 09/084,391

[22] Filed: May 27, 1998

[30] Foreign Application Priority Data

Dec. 24, 1997 [KR] Rep. of Korea ................ 97/73434

[51] Int. Cl.[7] ............................................ G11C 29/00
[52] U.S. Cl. .................................. 714/711; 365/185.3
[58] Field of Search ................ 712/1, 23; 714/711; 365/185.3

[56] References Cited

U.S. PATENT DOCUMENTS

| | | | |
|---|---|---|---|
| 5,018,104 | 5/1991 | Urai | 365/185.09 |
| 5,051,691 | 9/1991 | Wang | 324/158 |
| 5,113,371 | 5/1992 | Hamada | 365/200 |
| 5,319,599 | 6/1994 | Kato | 365/200 |
| 5,341,329 | 8/1994 | Takebuchi | 365/185.3 |
| 5,515,320 | 5/1996 | Miwa | 365/185.1 |
| 5,715,253 | 2/1998 | Kim et al. | 714/711 |

*Primary Examiner*—Meng-Ai T. An
*Assistant Examiner*—Mackly Monestine
*Attorney, Agent, or Firm*—Fleshner & Kim, LLP

[57] ABSTRACT

A redundancy circuit for a semiconductor integrated circuit is disclosed, which includes each cell of the column redundancy cell block corresponding to each cell of the cell sub-array is connected opposite to the connection of the cells of the cell sub-array, wherein a state that an electric charge corresponding to a data written into each cell of the cell sub-array and the column redundancy cell block is discharged, is measured for thus accurately checking the position of the repaired cell after the redundancy operation is performed.

7 Claims, 6 Drawing Sheets

FIG. 6

| RWL | 1 | 1 | 1 | 1 | 1 | • | • | • | • | • | 1 |
|---|---|---|---|---|---|---|---|---|---|---|---|
| | MEMORY CELL SUB-ARRAY | | | | | | | | | | |
| WLi | 0 | 0 | 0 | 0 | 0 | • | • | • | • | • | 1 |
| WL3 | 0 | 0 | 0 | 0 | 0 | • | • | • | • | • | 1 |
| WL2 | 0 | 0 | 0 | 0 | 0 | • | • | • | • | • | 1 |
| WL1 | 0 | 0 | 0 | 0 | 0 | • | • | • | • | • | 1 |
| WL0 | 0 | 0 | 0 | 0 | 0 | • | • | • | • | • | 1 |
| | YSEL0 | YSEL1 | YSEL2 | YSEL3 | YSEL4 | | | | | | RYSEL |

REDUNDANCY CIRCUIT FOR SEMICONDUCTOR INTEGRATED CIRCUIT

BACKGROUND OF THE INVENTION

1. Field of the Invention

The present invention relates to a redundancy circuit for a semiconductor integrated circuit, and in particular to an improved redundancy circuit for a semiconductor integrated circuit which is capable of accurately recognizing the position of a repaired cell after a redundancy is performed by a DRAM.

2. Description of the Background Art

In the known art, an auxiliary cell is used to prevent the entire wafer from being not used due to an error cell which is produced in the wafer after a wafer process is performed with respect to a semiconductor device such as a DRAM. Here, the error cells produced during the wafer test operation are substituted with the auxiliary cells. The above-descried auxiliary cell is called a redundancy cell.

FIG. 1 illustrates a conventional semiconductor integrated circuit which includes a row decoder 1 and a column decoder 2 receiving an address signal Ai, respectively, a cell sub-array 3 for storing and outputting a data in accordance with one selected among a word line WLi decoded by the row decoder 1 and two bit lines BITi and BITiB decoded by the column decoder 2, a sense amplifier block 4 for amplifying the data outputted from the cell sub-array 3 and outputting the thusly amplified data through input/output buses IO and IOB, and a row redundancy cell block 5 and a column redundancy cell block 6 for substituting a predetermined number of cells including the error cells when there are error cells in the cell sub array 3 with a predetermined number of word lines WL or columns. An input/output gate is provided in the interior of the sense amplifier block 4 for controlling the input/output of the data.

FIG. 2 illustrates the detailed circuits of the cell sub array 3, the sense amplifier block 4 and the column redundancy cell block 6 of FIG. 1.

As shown therein, the cell sub array 3 and the column redundancy cell block 6 are configured in a folded bit line structure in which the bit line BITi and the bit bar line BITiB are connected with the sense amplifiers 41, 42, 43 and 4R. The sense amplifier block 4 includes a plurality of input/output gates 401, 402, 403, 40R connected with the bit line BITi and the bit bar line BITiB through the sense amplifiers 41, 42, 43 and R4 and the input/output buses IO and IOB.

The input/output gates 401, 402, 403, 40R each include first switching transistors T11, T12, T13 and T1R selected in accordance with selection signals YSELi and RYSEL from the column decoder 2 and connecting the bit line BITi and input/output bus IO, and second switching transistors T21, T22, T23 and T2R selected in accordance with the selection signals YSELi and RYSEL and connecting the bit bar line BITiB and input/output bar bus IOB.

End portions of the cells M3 and M4 of the cell sub-array 3 are connected with a bit line BITO, and the bit line BITO is connected with one end of the first switching transistor T11 of the input/output gate 401, and the other end of the first switching transistor T11 is connected with the input/output bus IO. In addition, end portions of the cells M1, M2 and M5 of the cell sub-array 3 is connected with the bit bar line BITOB, and the bit bar line BITOB is connected with one end of the second switching transistor T21 of the input/output gate 401, and the other end of the second switching transistor T21 is connected with the input/output bar bus IOB.

End portions of the cells RM3 and RM4 of the column redundancy cell block 6 is connected with the bit line RBIT, and the bit line RBIT is connected with one end of the first switching transistor T1R of the input/output gate 40R through a sense amplifier 4R, and the other end of the first switching transistor T1R is connected with the input/output bus IO. In addition, end portions of the cells RM1, RM2 and RM5 of the column redundancy cell block 6 are connected with the bit bar line RBITB, respectively, and the bit bar line RBITB is connected with one end of the second switching transistor T2R of the input/output gate 40R, and the other end of the second switching transistor T2R is connected with the input/output bar bus IOB.

During the testing of the wafer, when an error occurs in the cell sub-array 3, the fuse (not shown) connected with the error cell is cut, so that the cell is not operated. At this time, the cell block in which an error occurs is substituted with the column redundancy cell block 6. In the column decoder 2, the bit line BITi and the bit bar line BITiB connected with the error cell are substituted with the bit line RBIT and the bit bar line RBITB, and the selection signal YSELi is substituted with the selection signal RYSEL.

For example, a predetermined cell among the cells M1 through M5 connected with the first bit lines BITO and BITOB is judged to have an error, the fuse (not shown) connected with each cell is cut, and the column decoder 2 outputs a selection signal RYSEL connected with the column redundancy cell block 6 instead of outputting the first selection signal YSELO. Therefore, the cells M1 through M5 are substituted with the cells RM1 through RM5 of the redundancy cell block 6. Therefore, the data to be stored into the cells M1 through M5 of the cell sub-array 3 are stored into the cells RM1 through RM5 of the column redundancy cell block 6.

In other words, assuming that the cells M1 through M5 are normally operated, the data stored in the cells M3 and M4 are carried on the bit line BITO and are transferred to the sense amplifier 41. Therefore, the switching transistor T11 of the input/output gate 401 is turned on by the first selection signal YSELO, so that the data are outputted to the outside through the input/output bus IO. In the same manner, the data stored in the cells M1, M2 and M5 are outputted to the outside through the bit bar line BITOB, the second switching transistor T21 and the input/output bar bus IOB.

On the contrary, assuming that the cells M1 through M5 are substituted with the cells RM1 through RM5 of the column redundancy cell block 6, the data stored in the cells RM3 and RM4 are carried on the bit line RBIT and transferred to the sense amplifier 4R, so that the first switching transistor T1R of the input/output gate 40R is turned on, and the data are outputted to the outside through the input/output bus IO. In the same manner, the data stored in the cells RM1, RM2 and RM5 are outputted to the outside through the bit bar line RBITB, the second switching transistor T2R and the input/output bar bus IOB.

Therefore, the data to be written into the cells M1 through M5 are written into the cells MR1 through MR5, and the selection signal YSELO from the column decoder 6 is substituted with the selection signal RYSEL.

When the repairing is finished, the cells RM1 through RM5 of the column redundancy cell block 6 operate on behalf of the cells M1 through M5 of the cell sub-array 3 containing an error, so that the circuit is normally operated.

The above-described repairing operation is performed during the testing of the wafer. Namely, the fabricator does not recognize the fact that the error cell is substituted and then the redundancy cell is used.

FIG. 3 illustrates the construction of an apparatus for checking whether the redundancy cell is used or not in the circuit of FIG. 2. As shown therein, the apparatus includes a test mode setting unit 31 for outputting a test signal TMODE in accordance with the logic states of a RAS bar signal /RAS, a CAS bar signal /CAS, a word enable signal NVE and an address signal Ai-Ak, an NMOS transistor M1 for receiving the test signal TMODE through the gate, a current limit resistor R connected between the pad 32 and one terminal 33 of the NMOS transistor M1, and a fuse F connected between the other terminal 34 of the NMOS transistor M1 and a ground terminal 35. The current limit resistor R, the NMOS transistor M1 and the fuse F are connected in series between the pad 32 and the ground terminal 35.

The operation of the circuit of FIG. 3 will now be explained with reference to FIG. 4.

The RAS bar signal /RAS, the CAS bar signal /CAS, the word enable bar signal /WE and the address signal Ai-Ak are inputted into the test mode setting unit 31, and the CAS bar signal /CAS and the word enable signal /WE are transited to a low level, respectively, and the RAS bar signal /RAS is transited to a low level. The test signal TMODE from the test mode setting unit 31 is transited to an active high state by the low level RAS bar signal /RAS, and the NMOS transistor M1 is turned on by the test signal TMODE.

Since the NMOS transistor M1, the current limit resistor R and the fuse F are connected in series between the pad 32 and the ground terminal 35, when the fuse F is cut, the current flowing path is cut. Therefore, the current does not flow through the pad 32. On the contrary, when the fuse F is not cut, a current having a predetermined level flows through the pad 32. Therefore, it is possible to check whether the fuse F is cut or not by measuring the current flowing through the pad 32, and it is possible to judge whether the redundancy cell is used or not based on the measured current value.

The redundancy circuit used in the conventional semiconductor integrated circuit is capable of preventing the entire wafer from not being used due to the error cell by judging whether the redundancy circuit is repaired or not. However, in order to check whether the cell is repaired or not, the additional apparatus shown in FIG. 3 is needed. In addition, since it is impossible to recognize an accurate information with respect to the error cell, a predetermined measurement with respect to the occurrence of the error cell is not provided. Therefore, in the redundancy circuit used in the conventional semiconductor integrated circuit, it is impossible to prevent the occurrence of the error cell.

SUMMARY OF THE INVENTION

Accordingly, it is an object of the present invention to provide a redundancy circuit for a semiconductor integrated circuit which overcomes the aforementioned problems encountered in the background art.

It is another object of the present invention to provide a redundancy circuit for a semiconductor integrated circuit which is capable of recognizing an accurate information with respect to an error cell by designing the data written into each cell of a memory cell sub-array and a data written into each cell of the redundancy cell block provided in the position corresponding to the cell to be opposite for thus preventing the error cell of the cell sub-array by accurately recognizing the information with respect to the error cell.

To achieve the above objects, there is provided a redundancy circuit for a semiconductor integrated circuit which includes each cell of the column redundancy cell block corresponding to each cell of the cell sub-array is connected opposite to the connection of the cells of the cell sub-array, wherein there are provided a row redundancy cell block and a column redundancy cell block being connected with a bit line and a bit bar line and substituting a predetermined number of cells containing an error cell by the word line unit or the column unit when a predetermined cell of the cell sub-array has an error.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 6 is a view illustrating the pattern of a data written into each cell of the circuit of FIG. 5.

DETAILED DESCRIPTION OF THE PREFERRED EMBODIMENTS

Figure 5:
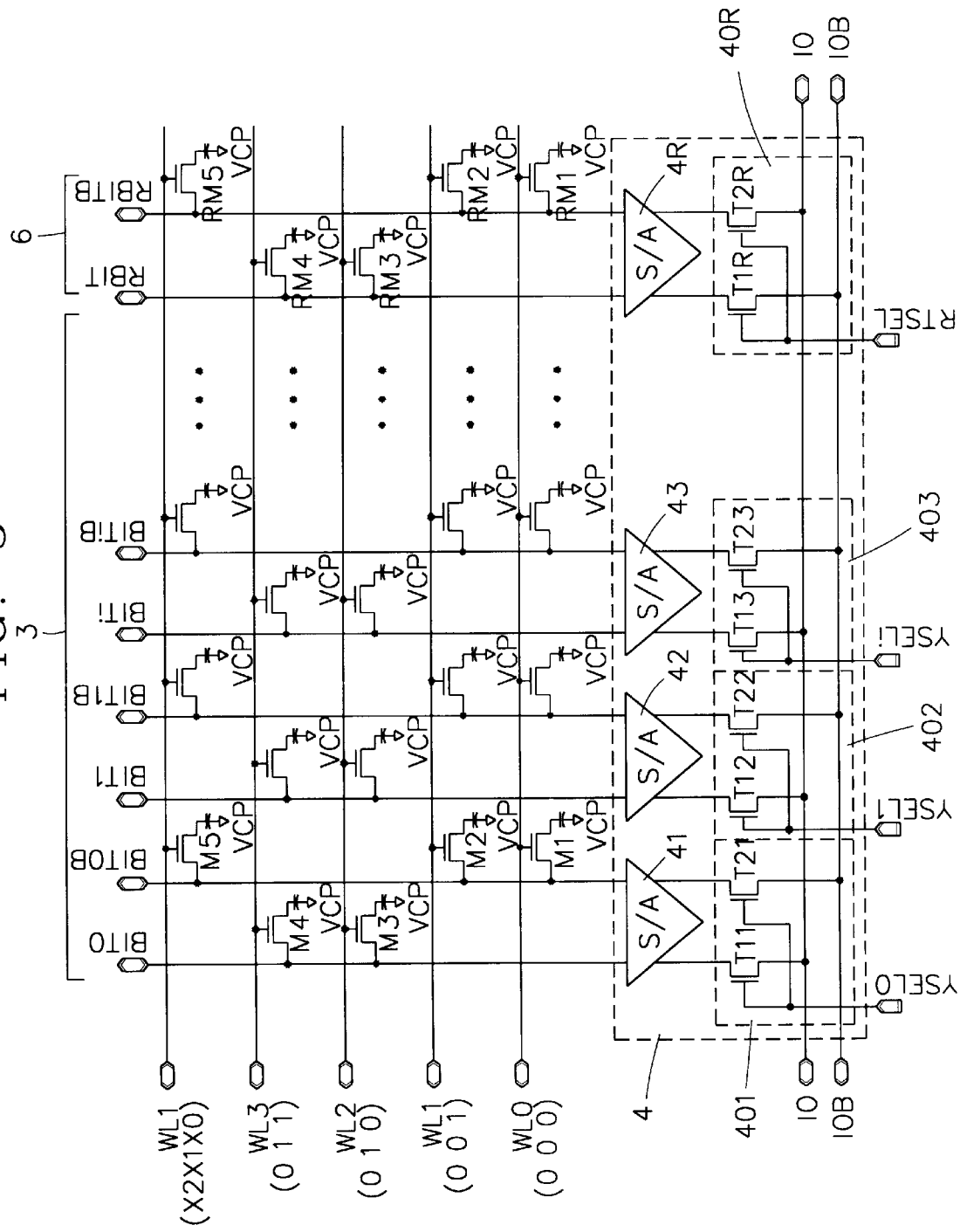
FIG. 5 is a circuit diagram illustrating a redundancy circuit of a semiconductor integrated circuit according to the present invention.

FIG. 5 illustrates the construction of a redundancy circuit of a semiconductor integrated circuit according to a first embodiment of the present invention. The connection between the bit line RBIT and bit bar line RBITB connected with the column redundancy cell block 6 and an input/output gate 40R of the sense amplifier block 4 differ from the connection of the conventional circuit shown in FIG. 2. The remaining construction is the same as the circuit of FIG. 2.

Namely, end portions of two cells RM3 and RM4 of the column redundancy cell block 6 are connected with a bit line RBIT, and the bit line RBIT is connected with one end of the first switching transistor T1R of the second input/output gate 40R through the second sense amplifier 4R of the sense amplifier block 4, and the other end of the first switching transistor T1R is connected with an input/output bar bus IOB. In addition, end portions of three cells RM1, RM2 and RM5 of the column redundancy cell block 6 are connected with a bit bar line RBITB, respectively, and the bit bar line RBITB is connected with one end of the second switching transistor T2R of the second input/output gate 40R through the second sense amplifier 4R, and the other end of the second switching transistor T2R is connected with an input/output bus IO.

Figure 1:
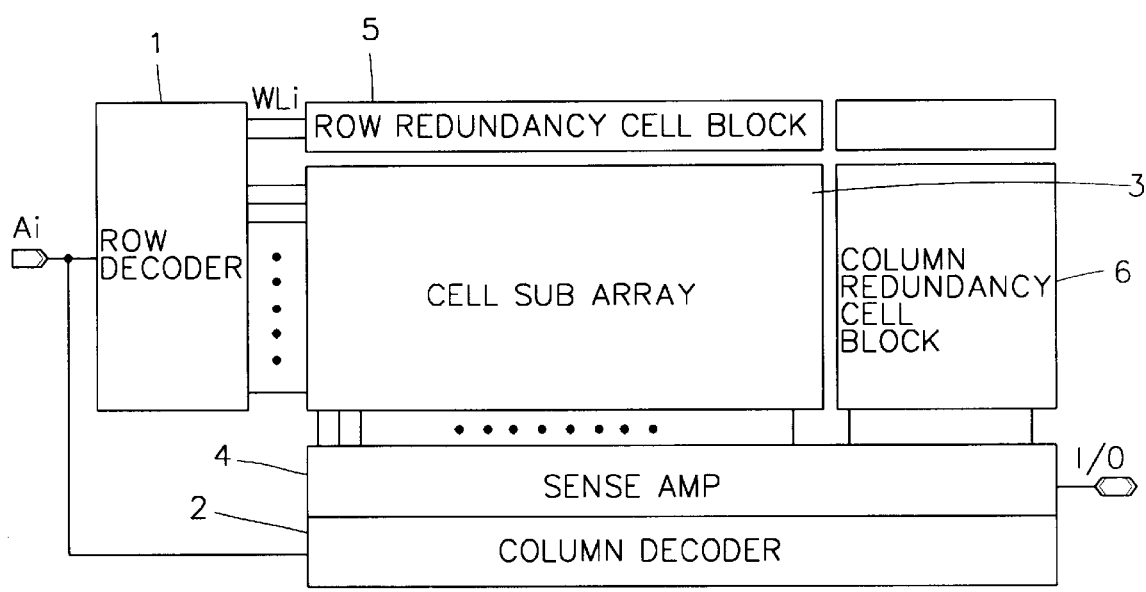
FIG. 1 is a view illustrating a conventional semiconductor integrated circuit.
Figure 2:
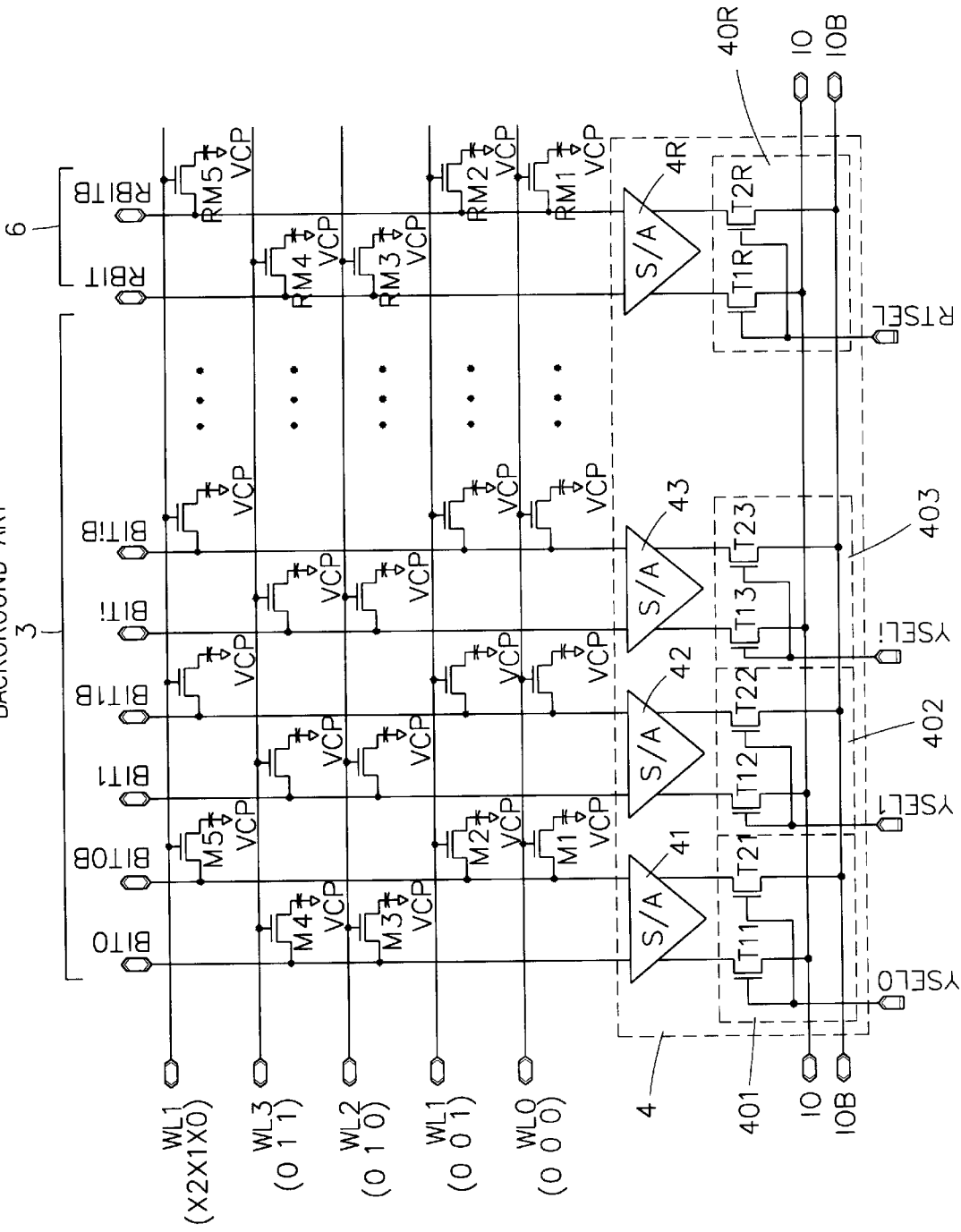
FIG. 2 is a circuit diagram illustrating a redundancy circuit for a conventional semiconductor integrated circuit.
Figure 3:
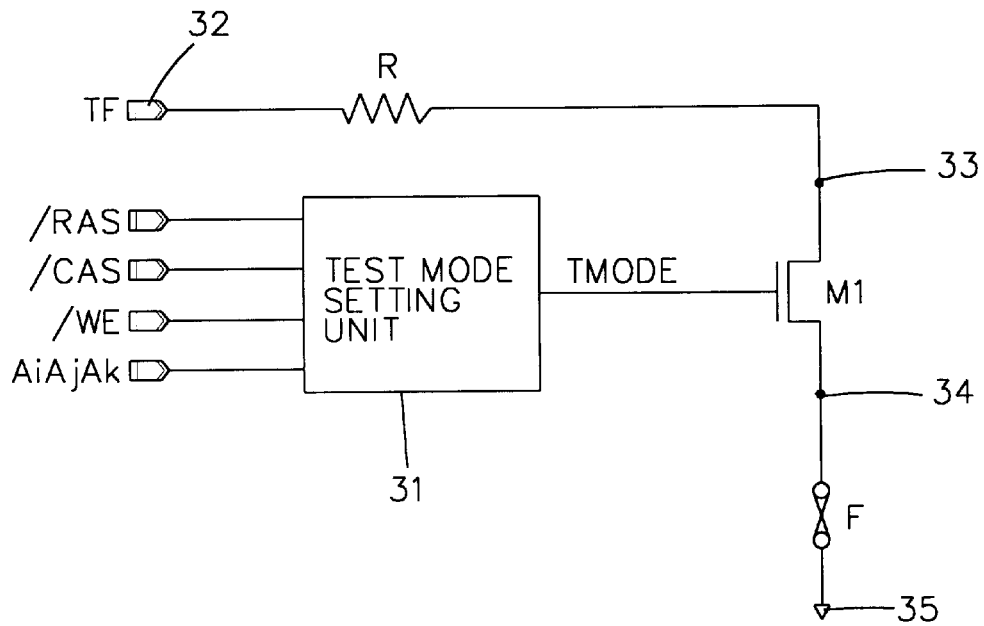
FIG. 3 is a view illustrating an apparatus for checking whether a redundancy circuit is used in the circuit of FIG. 2.
Figure 4:
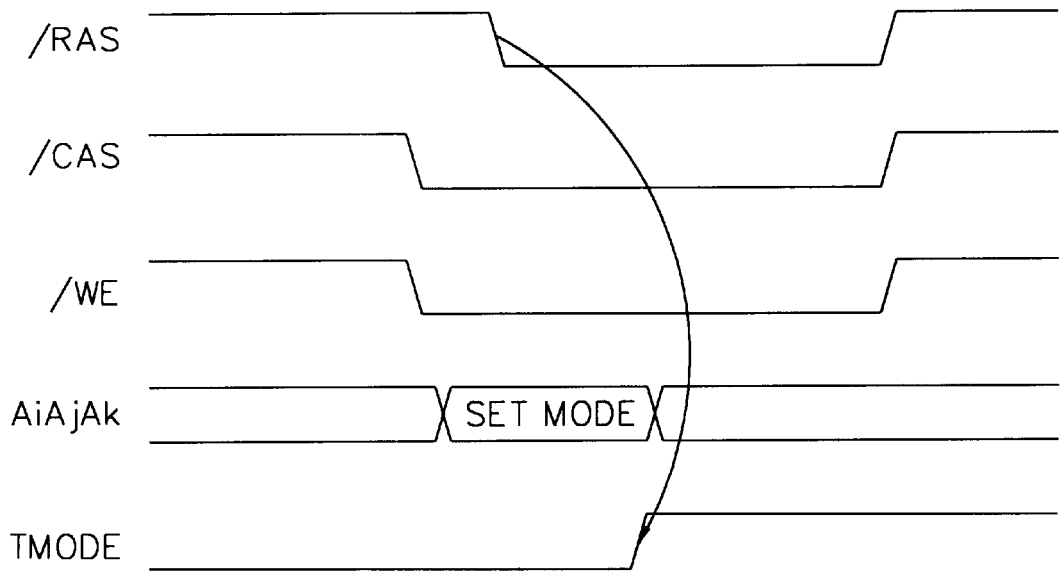
FIG. 4 is a wave form diagram illustrating signals from elements of the circuit of FIG. 3.

As shown in FIG. 2, the data stored in the two cells RM3 and RM4 are outputted through the bit line RBIT and input/output bus IO, and as shown in FIG. 5, the data stored therein are outputted through the bit line RBIT and input/ output bus IOB. In addition, as shown in FIG. 2, the data stored in the three cells RM1, RM2 and RM5 are outputted through the bit bar line RBITB and input/output bar bus IOB, and as shown in FIG. 5, the data stored therein are outputted through the bit bar line RBITB and input/output bus IO.

The operation of the redundancy circuit for a semiconductor integrated circuit according to the present invention will now be explained with reference to the accompanying drawings.

In the known art, the bit line BITO corresponds with the bit line RBIT, and the bit bar line BITOB corresponds with the bit bar line RBITB. In addition, the bit line RBIT is connected with an input/output bus IO, and the bit bar line RBITB is connected with an input/output bus IOB. However, in the present invention, the bit line RBIT is connected with an input/output bar bus IOB, and the bit bar line RBITB is connected with an input/output bus IO.

The cell arrangements of the cell sub-array 3 and the column redundancy cell block 6 are the same as in the known art. However, in the present invention, since the connection of two bit lines RBIT and RBITB of the column redundancy cell block 6 is opposite to the connection of the known art, if "0" is written into each of cells M1 through M5 of the cell sub-array 3, "1" is written into each of cells RM1 through RM5 of the column redundancy cell block 6.

Namely, as shown in FIG. 6, if the data "0" is written into each cell of the cell sub-array 3, since the connection of the two bit lines RBIT and RBITB of the column redundancy cell block 6 is opposite to the connection of the two bit lines BITi and BITiB of the cell sub-array, "1" is written into each of the cells RM1 through RM5 of the column redundancy cell block 6.

In addition, the time required when the data "0" and "1" stored in the cells in accordance with the characteristic of the memory are discharged are different in characteristic. Therefore, when performing a refreshing operation using the abovedescribed characteristic, it is possible to judge whether a predetermined cell of the cell sub-array 3 is repaired using the redundancy cell.

Namely, assuming that a predetermined cell among the cells M1 through M5 of the cell sub-array 3 connected with two bit lines BITO and BITOB has an error, when the wafer testing operation is performed, the cells M1 through M5 in which the error cell is contained are substituted with the cells RM1 through RM5 of the column redundancy cell block 6, and the selection signal YSELO of the column decoder is substituted with the selection signal RYSEL, so that the cells RM1 through RM5 operate on behalf of the operation of the cells M1 through M5.

On the above-described assumption, the following checking operation is performed.

When an address signal Ai is inputted, the word line WLi is selected by the row decoder 1, and the bit lines BITi, RBIT, BITiB and RBITB are selected by the column decoder 2. When the bit bar lines BITiB and RBITB become high levels by the column decoder 2, the bit lines BITI and RBIT become low levels. At this time, if the word line WLi becomes a high level, a physical data is written into each cell based on the scramble equation.

The testing apparatus includes an information concerning the data to be written into each cell, namely, an information indicating a state that a predetermined data will be written into a predetermined cell. For example, if the physical data "0" is written into the entire cells of the cell sub-array 3, the test apparatus recognizes that the data "0" is stored into the entire cells.

When the writing operation is finished, an electric charge corresponding to the data written into each memory cell, namely, the electric charge stored in each condenser is discharged. The time required when the electric charge corresponding to the data "1" is written into each cell differs from the time required when an electric charge corresponding to the data "0" is discharged. In more detail, the time required when the data "1" is discharged is faster by a tens of times compared to the time required when the data "0" is discharged.

When checking the data written into each cell using the testing apparatus at the time T before the electric charge corresponding to the data "0" is discharged after the time required when the electric charge corresponding to the data "1" is fully discharged, the data of the cell into which the data "0" is written is normally outputted as "0". However, the data of the cell into which the data "1" is written is changed to "0".

The value of the data stored in each cell of the test apparatus at the time T is "0", and the above-described data "0" and the data value which is currently outputted from each cell are compared.

If there is not an error cell, the data value which is currently outputted from each cell is "0".

Actually, the data value of the cells RM1 through RM5 is changed from "1" to "0". However, since the cells M1 through M5 are substituted with the cells RM1 through RM5, namely, the repairing operation is finished, the testing apparatus recognizes that the data values of the cells M1 through M5 are changed from "1" to "0".

Figure 7:
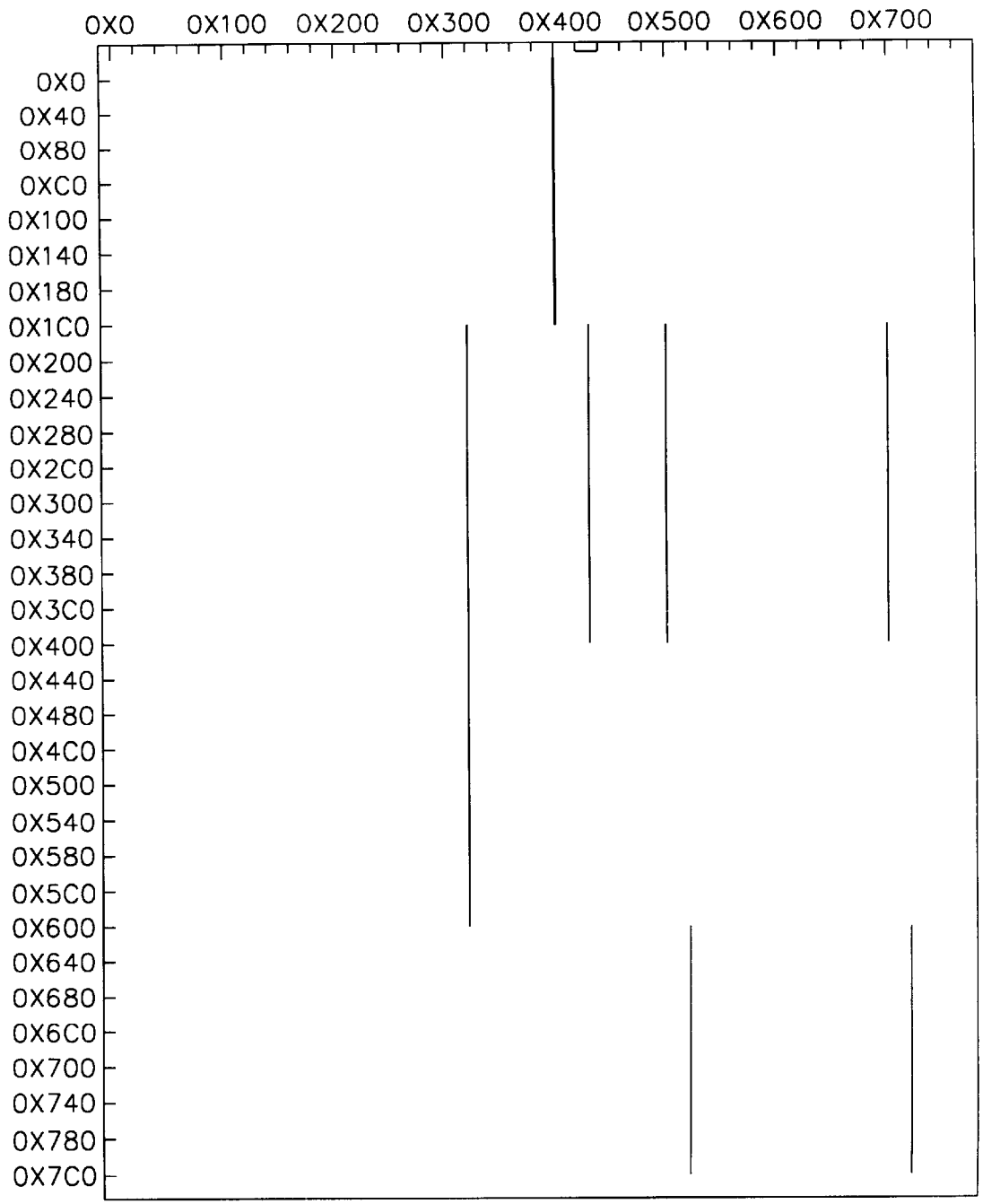
FIG. 7 is a view illustrating a bit map in which an error cell of a cell sub-array is displayed.

Therefore, the data value of the cells M1 through M5 stored in the testing apparatus at the time T are "0", and the data values which are currently outputted from the cells M1 through M5 are changed from "1" to "0". The testing apparatus compares the value previously stored in each cell with the value which is currently outputted. A result of the comparison is shown in a bit map form in FIG. 7.

If two values are different, the different portion is indicated in black color. The square of FIG. 7 denotes the entire regions of the cell sub-array, and the full line among the entire regions denotes a repaired portion.

Therefore, in the bit map, the full line indicated in black color denotes the repaired portion, and the regularly broken black line denotes that the error cells are substituted by the block unit.

The manufacturer recognizes that a predetermined cell of the cell sub-array is substituted with a redundancy cell block by seeing the bit map.

In the above-described operation, "0" is written into each cell of the cell sub-array 3, and "1" is written into each cell of the column redundancy cell block 6, so that the time required when "0" and "1" written into each cell are measured and checked. More preferably, "1" may be written into each cell of the cell sub-array 3 and "0" may be written into each cell of the column redundancy cell block 6, so that the time required when "1" and "0" are discharged are measured and checked.

In the present invention, the embodiment that the error cell of the cell sub-array is substituted with the cell of the column redundancy cell block is described. In another embodiment, the cell of the row redundancy cell block may be substituted in the above-described manner.

As described above, in the present invention, it is possible to check an error cell in the finished wafer, so that it is possible to provide a data by which an error cell is not fabricated. Therefore, it is possible to check the reason of the error cell using the above-described data for thus preventing further error cell in the future.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A redundancy circuit for a semiconductor integrated circuit including a cell sub-array, a redundancy cell block having column and row redundancy cell blocks for substituting a predetermined number of cells including an error cell in the cell sub-array, and a sense amplifier block for amplifying a data outputted from the cell sub-array and the redundancy cell block and outputting an amplified data through an input/output bus and an input/output bar bus, comprising: each cell of one of the row redundancy cell block and the column redundancy cell block corresponding to each of said substituted predetermined number of cells including the error cell of the cell sub-array and wherein a bit line of the cell sub-array is connected with the input/output bus, a bit bar line of the cell sub-array is connected with the input/output bar bus, a bit line of the redundancy cell block is connected with the input/output bar bus, and a bit bar line of the redundancy cell block is connected with the input/output bus.

2. The circuit of claim 1, wherein said sense amplifier block includes:

at least one first sense amplifiers connected with the two bit lines of the cell sub-array;

a second sense amplifier connected with the two bit lines of the redundancy cell block;

at least one first input/output gates connected with the at least one first sense amplifiers and the two input/output buses; and a second input/output gate connected with the second sense amplifier and the two input/output buses.

3. The circuit of claim 2, wherein said at least one first input/output gates each include:

at least one first switching transistors connected with the bit line of the cell sub-array and the input/output bus, and a plurality of second switching transistors connected with the bit bar line of the cell sub-array and the input/output bar bus; and wherein said second input/output gate includes:

a first redundancy switching transistor connected with the bit line of the redundancy cell block and the input/output bar bus, and a second redundancy switching transistor connected with the bit bar line of the redundancy cell block and the input/output bus.

4. The circuit of claim 1, wherein a data is written into each cell of the cell sub-array, and an electric charge corresponding to the written data is discharged and measured for said each cell of the cell sub-array.

5. The circuit of claim 4, wherein a first time when measuring the discharged electric charge corresponding to "1" for a cell of the cell sub-array is before a second time for measuring the discharged electric charge corresponding to "0" for the cell.

6. The circuit of claim 4, wherein the data written and the corresponding discharged electric charge is compared.

7. The circuit of claim 1, wherein during circuit test operation a prescribed value is first stored in each cell of the cell sub-array, wherein the test operation stored values are output from the cell sub-array, and wherein the redundancy cell block replacement of error cells in the cell sub-array is indicated by ones of the test operation stored values that are not equal to the prescribed value.

* * * * *